United States Patent [19]

Kennedy et al.

[11] Patent Number: 4,975,653
[45] Date of Patent: Dec. 4, 1990

[54] FM DETECTOR USING SWITCHED CAPACITOR CIRCUITS

[75] Inventors: Richard A. Kennedy, Russiaville, Ind.; Seyed R. Zarabadi, Columbus, Ohio

[73] Assignee: Delco Electronics Corporation, Kokomo, Ind.

[21] Appl. No.: 419,570

[22] Filed: Aug. 29, 1989

[51] Int. Cl.$^5$ ............................................. H03D 3/00
[52] U.S. Cl. ..................................... 329/318; 307/519; 328/140; 329/327; 329/341; 375/82; 455/214
[58] Field of Search ............... 329/318, 320, 327, 341, 329/342; 307/519; 328/140; 375/82; 455/214

[56] References Cited

U.S. PATENT DOCUMENTS

| | | | |
|---|---|---|---|
| 4,704,545 | 11/1987 | Tanaka et al. | 328/127 X |
| 4,752,704 | 6/1988 | Baccarani et al. | 307/573 |
| 4,783,635 | 11/1988 | Sevastopoulos | 328/167 X |

Primary Examiner—Siegfried H. Grimm
Attorney, Agent, or Firm—Albert F. Duke

[57] ABSTRACT

An integrated circuit FM detector which compensates for variations in semiconductor manufacturing process and temperature employs a pair of serially connected switched capacitor-operational amplifier combinations. The first combination is a frequency to voltage converter which uses a switched capacitor input circuit which is clocked at the frequency of the input signal, an operational amplifier and a feedback resistor. The second combination is a compensation circuit which uses an input resistor, a feedback switched capacitor circuit and an operational amplifier. The feedback switched capacitor circuit is clocked at a fixed rate. Reversal of the roles of the resistor and the switched capacitor in the first and second combinations compensates for both temperature and manufacturing process variations. The electrical separation of the input and feedback switched capacitor circuits helps to insure against the generation of unwanted noise in the form of beat frequencies which could be generated if the switched capacitor circuits were used as the input and feedback circuits of a single operational amplifier.

21 Claims, 2 Drawing Sheets

FM DETECTOR USING SWITCHED CAPACITOR CIRCUITS

FIELD OF THE INVENTION

This invention relates to an integrated circuit FM detector for an FM receiver.

BACKGROUND OF THE INVENTION

Frequency modulation of a carrier signal (FM) has been used extensively in both radio and wire transmission systems. Frequency modulation systems have the potential for high fidelity essentially noise free transmission of intelligence. However, achievement of this potential depends upon the fidelity of both the modulation and detection of the transmitted signal free from internal circuit noise and receipt of a reasonably strong signal at the receiver. For purpose of discussion of the present invention, the parameters of a standard commercial FM broadcast signal are employed. In the United States, FM broadcast carrier signals lie between 87.5 mHz and 108.0 mHz. The transmitted carrier is modulated plus and minus 75 kHz. The signal received at an FM receiver is mixed with the output of a tunable local oscillator to generate an Intermediate Frequency (IF) signal (e.g., 450 kHz modulated in accordance with the received radio frequency signal).

An FM detector is essentially a frequency to voltage converter. Early FM detectors comprise differentiators, diode detectors and filters. The output of a prior art FM detector is an "S" curve with zero output in the presence of an IF signal without modulation and plus and minus signals in the presence of modulation on the IF signal. Only the linear portion of the "S" curve is usable for FM reception. The coils and resistors of such prior art circuits do not translate to construction as integrated circuits.

With the advent of switched capacitor circuits to simulate resistors in integrated circuits, integrated circuit frequency to voltage converters have been suggested. An example of a frequency to voltage converter is found in an article entitled "Switched-Capacitor Frequency-to-Voltage and Voltage-to-Frequency Converters" published in the *IEEE TRANSACTIONS ON CIRCUITS AND SYSTEMS VOL* 33, *NO* 6, *August* 1986. The referenced article suggests the use of the circuits disclosed therein as being suitable for use in a modem for FM signals. However, there is a serious possibility of internally generated noise when the suggested circuits are employed as an FM detector in a receiver for a standard commercial broadcast signal. The unwanted noise at the output of the detector occurs as beat frequencies of the clock signals generated at the input from the received FM signal and the fixed rate clock signals employed in the switched capacitor feedback circuit.

It is desirable to have an integrated circuit FM detector which uses switched capacitor circuits that do not generate undesirable noise due to beat frequencies.

SUMMARY OF THE INVENTION

The present invention is directed to circuitry which performs an FM detector function. The circuitry comprises a first amplifier having an input and an output, a first switched capacitor circuit having an output and inputs which are coupled to circuitry input terminals, a first continuous time impedance feedback circuit coupled between the input and output of the first amplifier, a second amplifier having an input and having an output coupled to a circuitry output terminal, a gain matching circuit coupled between the output of the first amplifier and the input of the second amplifier, and a second switched capacitor circuit coupled between the input and output of the second amplifier. The ratio of the impedance of the gain matching circuit to the impedance of the continuous time impedance feedback circuit is at a preselected value. In a preferred embodiment the preselected value is 1 and the gain matching circuit and the continuous time impedance feedback circuit are both resistors. The second switched capacitor circuit, which is coupled between the input and output of the second amplifier, has inputs and is adapted to be controlled by signals applied to the inputs.

Viewed from another aspect, the present invention is directed to an integrated circuit FM detector which comprises a frequency to voltage converter and a compensation circuit. The frequency to voltage converter comprises a first amplifier, a first switched capacitor circuit and a continuous time impedance feedback circuit. The compensation circuit comprises a second amplifier, a compensating circuit and a second switched capacitor circuit. The first switched capacitor circuit has inputs coupled to FM detector input terminals and has a first terminal coupled to an input of the first amplifier. The feedback circuit is coupled between the input and an output of the first amplifier. The ratio of the impedance of the compensating circuit to the impedance of the continuous time impedance feedback circuit is at a preselected value which in an illustrative embodiment is 1. The gain matching circuit is coupled between the output of the first amplifier and an input of the second amplifier. The second switched capacitor is coupled between the input and an output of the second amplifier. The output of the second amplifier coupled to an FM detector output terminal The first and second switched capacitor circuits have similar structures and are fabricated using a common process such that variations in the process and in operating temperature essentially cancel out. The first switched capacitor circuit is controlled by an IF FM signal applied to inputs thereof and demodulates the applied signal and provides the demodulated signal at an output thereof. The second switched capacitor has a fixed frequency signal applied to inputs thereof which results in the second switched capacitor circuit being essentially the equivalent of a fixed value resistor. In a preferred embodiment the compensating circuit is a multi-segment resistor that is part of a low pass filter that couples the output of the first amplifier to the input of the second amplifier. A voltage offset resulting from the first switched capacitor circuit is modified and compensated for by a first resistor coupled to the input of the first amplifier, and by a second resistor and a third switched capacitor circuit which are both coupled to the input of the second amplifier.

The use of the first switched capacitor circuit as an input to the first amplifier and the use of a second switched capacitor circuit as a feedback element of the second amplifier serves to electrically separate the two switched capacitor circuits. Accordingly, beat frequencies which would likely occur if the two are used as an input circuit and as feedback circuit, respectively, of a single amplifier are essentially eliminated. The use of switched capacitor circuits having similar structures that are fabricated (manufactured) using a common integrated circuit (IC) process results in a cancelling out of process and operating temperature variations Viewed from still another aspect, the present invention is directed to frequency to voltage converter circuitry. The circuitry comprises an amplifier having an input and an output, a switched capacitor circuit having an output and inputs coupled to circuitry input terminals, and a continuous time impedance feedback circuit coupled between the input and output of the amplifier. The switched capacitor circuit is controlled by signals applied to inputs thereof. The output of the switched capacitor circuit is coupled to the input of the amplifier, and the output of the amplifier is coupled to a circuitry output terminal.

The invention will be better understood from the following more detailed description taken with the accompanying drawings and claims.

DETAILED DESCRIPTION

Figure 1:
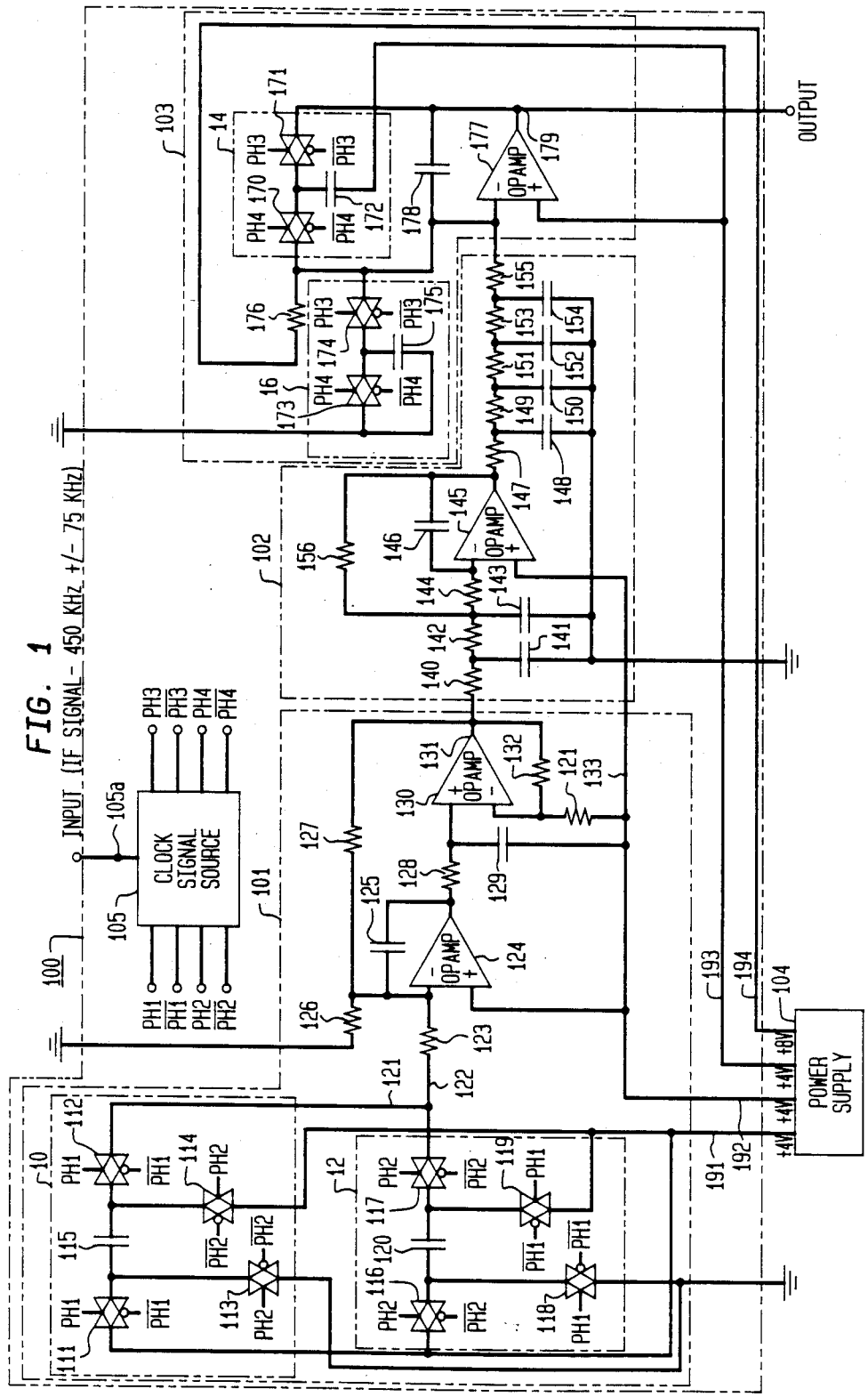
FIG. 1 shows a schematic and block drawing of an FM detector in accordance with the present invention.

Referring to FIG. 1, there is shown an FM detector 100 (shown within a dashed line irregular box) in accordance with an embodiment of the invention. FM detector 100 comprises a frequency to voltage converter (shown within a dashed line irregular box) 101, a compensation circuit (shown within a dashed line irregular box) 103, and a clock signal source 105. A power supply 104 used to power FM detector 100 has three separate outputs which in this illustrative embodiment are shown as +4 volts each and are coupled to conductors 191, 192, and 193 respectively, and has a separate fourth output of +8 volts which is coupled to a conductor 194.

Clock source 105 has an input terminal 105a which serves as an input terminal of FM detector 100. An intermediate frequency (IF) signal of 450 kHz plus or minus 75 kHz is shown applied to input terminal 105a. This IF frequency is typically derived from a broadcast FM radio signal (not shown) which is received on an antenna (not shown) coupled to a radio frequency (RF) amplifier (not shown). An output of the RF amplifier serves as one input to an FM mixer (not shown) which has a second input coupled to an FM oscillator (not shown). The output of the FM mixer or a subsequent FM mixer (not shown) is the IF signal input applied to input terminal 105a. The IF signal is centered at 450 kHz and is modulated plus and minus 75 kHz. Clock signal source 105 has pairs of output terminals PH1, PH1 Bar (shown as PH1 with an overscore), PH2, PH2 Bar (shown as PH2 with an overscore), PH3, PH3 Bar (shown as PH3 with an overscore), PH4 and PH4 Bar (shown as PH4 with an overscore). At each pair of output terminals the signals generated are complements of each other. The signals generated on PH1 and PH2 are non-overlapping clock signals which correspond to the zero crossings of the IF input signal. Intelligence of the IF input signal is represented by variations in frequency of that signal since the IF input frequency signal varies as a function of a modulating signal (not shown), the frequency of the signal generated at terminals PH1 and PH2 also vary in accordance with the modulation of the IF signal. Signals generated on outputs PH3 and PH4 are non-overlapping fixed rate 3.6 mHz clock signals.

Figure 2:
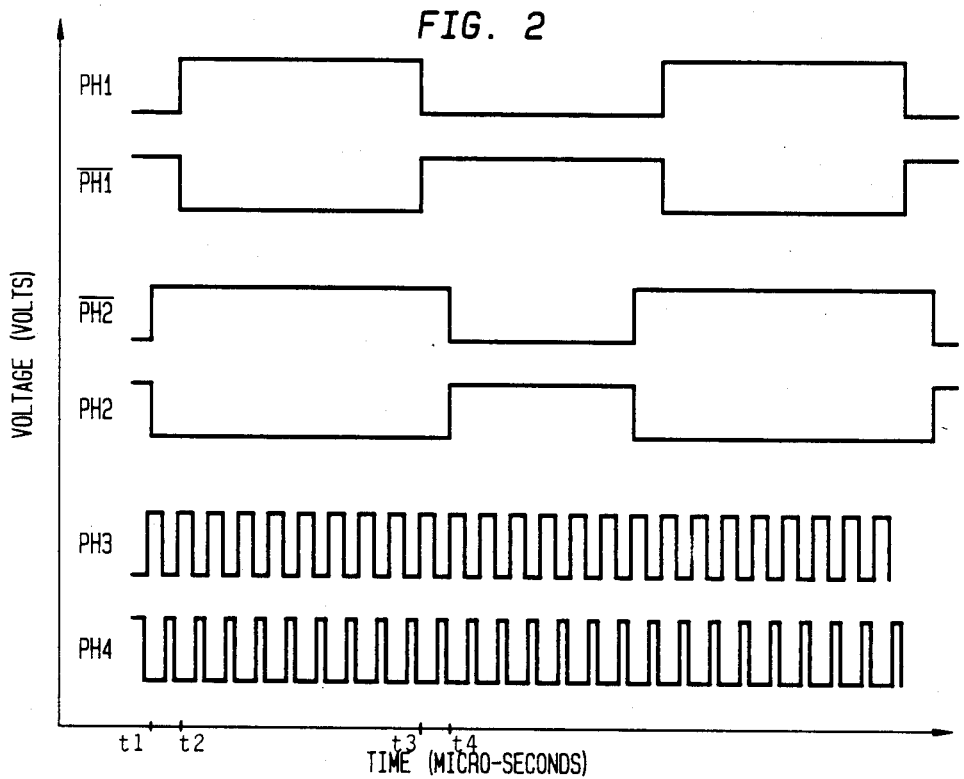
FIG. 2 shows clocking signals employed in the FM detector of FIG. 1.
Figure 3:
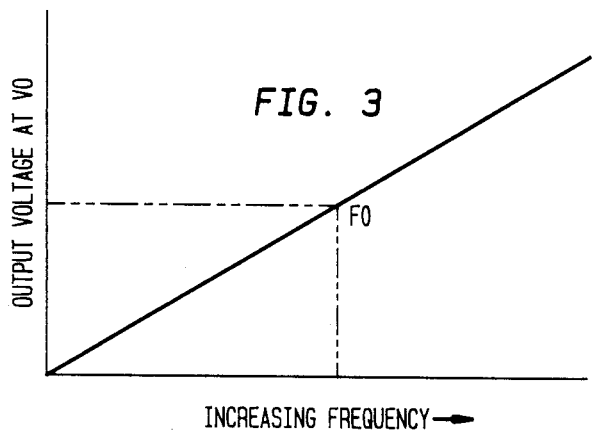
FIG. 3 shows the detector output signal as a function of frequency.

Referring to FIG. 2, there are graphically shown signal waveforms generated by clock signal source 105 onto outputs PH1, PH1 Bar, PH2, PH2 Bar, PH3 and PH4. It is to be noted that PH1 Bar is the complement of PH1 and that PH2 is essentially the inversion of PH1 except that it goes low (e.g., at T=1) before PH1 goes high (e.g., at T=t2) and it goes high (e.g., at T=t4) after PH1 goes low (e.g, at T=t3). Thus PH1 and PH2 are denoted as being non-overlapping. PH2 Bar is the complement of PH2 as PH3 Bar (not shown) is the complement of PH3 and as PH4 Bar (not shown) is the complement of PH4. PH3 bears the same relationship to PH4 (i.e., they are non-overlapping) as PH1 bears to PH2. PH1, PH2, PH3 and PH4 and the complements thereof serve as inputs to FM receiver 100 which has an output terminal 179 at which is generated an output signal voltage.

The frequency to voltage converter 101 comprises first and second switched capacitor circuits (shown within separate dashed line rectangles) 10 and 12, an inverting operational amplifier 124, a non-inverting operational amplifier 130, resistors 121, 123, 126, 127, 128, 132, and capacitors 125 and 129. Switched capacitor circuit 10 comprise transmission gates 111, 112, 113 and 114 and a capacitor 115. Switched capacitor circuit 12 comprises transmission gates 116, 117, 118 and 119 and a capacitor 120. In an illustrative embodiment each of the transmission gates 111, 112, 113, 114, 116, 118 and 119 comprises a n-channel and a p-channel metal-oxide-semiconductor field effect transistor (MOSFET) coupled together in a parallel configuration to provide a low impedance bilateral (two way) transmission path.

Figure 4:
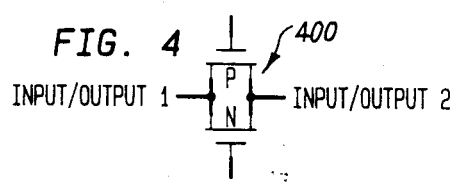
FIG. 4 shows an electrical schematic of a typical transmission gate used in the FM detector of FIG. 1.

FIG. 4 shows such a transmission gate 400, which is useful as transmission gates 111-114 and 116-119, in which a first common first set of output terminals of the two transistors are coupled to a first terminal (shown as input/output 1) and in which a second common set of output terminals of the two transistors are coupled to a second terminal (shown as input/output 2). Transmission gate 400 is typically operated by applying a first control signal to the gate of the p-channel transistor and the complement (inverse) signal to the gate of the n-channel transistor. For example, in transmission gate 111 of FIG. 1, PH1 is applied to a first control terminal thereof (i.e., the gate of a p-channel transistor) and PH1 Bar is applied to a second control terminal thereof (i.e., the gate of an n-channel transistor) to control conduction therethrough.

As employed herein, the term "switched capacitor circuit" means a circuit in which equal packets of electrical charge are conveyed from or through a capacitor to a load. In such circuits it is essential that the capacitor be fully charged and discharged during each cycle of operation. A switched capacitor circuit is essentially the electrical equivalent of a resistor connected between a source potential (e.g., a fixed bias potential or a signal source) and a load (e.g., the input of an operational amplifier). It is a discrete time equivalent of a resistor which is a continuous time device. The effective resistance of a switched capacitor circuit varies inversely as a function of both capacitor size and frequency of operation.

First input/outputs of transmission gates 111, 114, 116 and 119 are coupled together to the conductor 191 which is coupled to the first +4 volt output terminal of the power supply 104. First input/outputs of transmission gates 113 and 118 are coupled to a reference voltage which is illustratively ground (zero volts). Second output/inputs of transmission gates 111 and 113 are coupled to a first terminal of capacitor 115. A second input/output of transmission gate 114 and a first input/output of transmission gate 112 are coupled to a second terminal of capacitor 115. Second input/outputs of transmission gates 116 and 118 are coupled to a first terminal of capacitor 120. A second input/output of transmission gate 119 is coupled to a first input/output of transmission gate 117 and to a second terminal of capacitor 120. Second input/outputs of transmission gates 112 and 117 are coupled via a conductor 121 to a first terminal of resistor 123. A second terminal of resistor 123 is coupled to a negative input of operational amplifier 124, to first terminals of resistors 126 and 127 and to a first terminal of capacitor 125. A positive input of operational amplifiers 124 and first terminals of capacitor 129 and resistor 121 are coupled via the conductor 192 to the second +4 output terminal of power supply 104. A second terminal of resistor 126 is coupled to ground. An output of amplifier 124 is coupled to a second terminal of capacitor 125 and to a first terminal of resistor 128. A second terminal of resistor 128 is coupled to a second terminal of capacitor 129 and to a positive input of amplifier 130. A negative input of amplifier 130 is coupled to a first terminal of resistor 132 and to a second terminal of resistor 133. An output of amplifier 130 is coupled to second terminals of resistors 127 and 132 and to a first terminal of a resistor 140 of narrow band filter 102 via a conductor 131.

As shown in FIG. 1, capacitor 115 is fully charged between the 4 volts on conductor 191 and ground during a high (a "1") on the second output PH2 of clock signal source 105 by operation of gates 113 and 114. Subsequently, during a time when there is a high (a "1") on the signal of output PH1, the left terminal of capacitor 115 is connected to the same 4 volts on conductor 191 by operation of gate 111, and the right terminal of capacitor 115 is connected to conductors 121 and 122 by operation of gate 112. The 4 volt initial charge on capacitor 115 and the subsequent +4 volt charge on conductor 191 via conductors 121 and 122 are additive and provide an 8 volt signal to resistor 123 and thus to the inverting (negative) input of amplifier 124. In the switched capacitor circuit 12, capacitor 120 is charged during the time the signal at PH1 is a "1", and discharged during the time the signal at PH2 is a "1". In the illustrative embodiment of FIG. 1, the switched capacitor input circuits 10 and 12 together operate at the equivalent of 900 kHz under clock control of an IF signal without modulation. In the illustrative embodiment, when the 450 kHz IF signal is not modulated, the switched capacitor circuits 10 and 12, acting together, appear as a resistor of 277,777 ohms connected between a plus 8 volt supply and the inverting input of operational amplifier (opamp) 124. When the IF signal is at 375 kHz (i.e., 450 kHz with minus 75 kHz modulation), the two circuits 10 and 12 together appear as a resistor of 333,333 ohms; and with an IF signal of 525 kHz, the circuits together appear as a resistor of 238,095 ohms. All resistor values are nominal values and may be different because of design, process and temperature variations.

As noted earlier herein, the desired dc output voltage at output terminal 179 for an IF signal without modulation is +4 volts. The switched capacitor input circuits 10 and 12, when there is a IF signal applied to the inputs thereof, cause an unwanted offset voltage in the output of opamp 124 and of succeeding opamp stages. Offset compensation resistor 126 and the ground connected thereto provide a second input to the inverting terminal of amplifier 124. The value of resistor 126 is 277,777 ohms which corresponds to the effective resistance of the switched capacitor input circuits 10 and 12 for an IF signal without modulation.

In the FM detector of FIG. 1, filtering is conveniently distributed throughout the detector For example, resistor 128 and capacitor 129 are part of the distributed filtering. Since opamp 130 is operated as a non-inverting amplifier, the output of amplifier 130 can provide feedback to the inverting (negative) input of opamp 124. In FIG. 1, feedback resistor 127 has a nominal value of 208,333 ohms. The gain of amplifiers 124 a d 130 is established by the ratio of value of feedback resistor 127 to the resistance of the circuits 10 and 12 connected to the inverting input of amplifier 124. In the absence of compensation circuit 103, manufacturing process and temperature variations in the resistors and capacitors of the frequency to voltage converter 101 may seriously alter the operating parameters of the circuit both initially and during the operating life of the circuit.

Narrow band filter 102 comprises an inverting operational amplifier (opamp) 145 with a first set of distributed series resistors 140, 142, and 144 and shunt capacitors 141 and 143 coupled to a negative input thereof a second set of distributed series resistors 147, 149, 151, 153 and 155 and shunt capacitors 148, 150, 152 and 154 coupled to an output thereof, a resistor 156 and a capacitor 146. A second terminal of the resistor 140 is coupled to a first terminal of resistor 142 and to a first terminal of capacitor 141. A second terminal of resistor 142 is coupled to a first terminal of resistors 144 and 156 and capacitor 143. A second terminal of resistor 144 is coupled to the negative input of amplifier 145 and to a first terminal of capacitor 146. An output of amplifier 145 is coupled to second terminals of resistor 156 and capacitor 146 and to a first terminal of resistor 147. A second terminal of resistor 147 is coupled to first terminals of resistor 149 and capacitor 148. A second terminal of resistor 149 is coupled to a first terminal af resistor 151 and capacitor 150. A second terminal of resistor 151 is coupled to first terminals of resistor 153 and capacitor 152. A second terminal of resistor 153 is coupled to first terminals of resistor 155 and capacitor 154. Second terminals of capacitors 141, 143, 148, 150, 152 and 154 are coupled to ground. A second terminal of resistor 155 is coupled to a negative input of an operational amplifier (opamp) 177 of the compensation circuit 103.

Resistors 147, 149, 151, 153, and 155 are constructed to be identical to the construction of feedback resistor 127. Resistor 127 is constructed of five equal sections corresponding to resistors 147–155 and those sections are interconnected by pads corresponding to the pads to which capacitors 148–154 are connected. Although shown as being part of the filter arrangement 102, the resistors 147–155 also form an input resistor for connection of the output of amplifier 145 to the inverting (negative) input of amplifier 177. The total value of series connected resistors 147 through 155 is 208,333 ohms which matches the value of resistor 127.

Compensation circuit 103 comprises the operational amplifier (opamp) 177, a third switched capacitor circuit (shown within the dashed line rectangle) 14, a fourth switched capacitor circuit 16 (shown within a dashed line rectangle) and a capacitor 178. Switched capacitor circuit 14 comprises transmission gates 170 and 171 and a capacitor 172. Switched capacitor circuit 16 comprises transmission gates 173 and 174 and capacitor 175.

First input/outputs of transmission gates 170 and 174 and a first terminal of resistor 176 are coupled to a first terminal of capacitor 178 and to the negative input terminal of amplifier 177. A second terminal of capacitor 178 is coupled to an output of amplifier 177, to a first input/output of transmission gate 171 and to the FM detector output terminal 179. Second input/outputs of transmission gates 170 and 171 are coupled to a first terminal of capacitor 172. A second terminal of capacitor 172 is coupled to a positive input of opamp 177 and via the conductor 193 and to the third +4 volt output terminal of power supply 104. A second input/output of transmission gate 174 is coupled to a first input/output of transmission gate 173 and to a first terminal of capacitor 175. A second terminal of capacitor 175 and a second input output of transmission gate 173 are coupled to ground potential. The control terminals (gates) of the transistors (not shown) of transmission gates 171 and 174 are coupled to outputs PH3 and PH3 Bar of clock signal source 105, and the control terminals (gates) of the transistors (not shown) of transmission gates 170 and 173 are coupled to outputs PH4 and PH4 Bar of clock signal source 105.

In the compensation circuit 103, feedback is provided by transmission gates 170 and 171 and capacitor 172.

During a time when the signal at output PH3 is high, a "1", the output potential of opamp 177 charges capacitor 172 to +4 volt via conductor 193. During the time when the signal from output PH4 is a "1", the charge on capacitor 172 is delivered to the inverting input of opamp 177 via gate 170. Non-overlapping clocks PH3 and PH4 have a fixed frequency of 3.6 mHz. The effective resistance of the feedback circuit, operating at a fixed frequency, is selected to be 277,777 ohms in order to match the resistance of the switched capacitor input arrangement when the IF signal is not modulated. The value of the capacitor 172 in FIG. 1 is 1 pF.

As seen from the above discussion, the roles of the switched capacitor input circuits 10 and 12 and the feedback resistor 127 of converter 101 are reversed in the compensating circuit 103 by switched capacitors feedback circuits 14 and 16 and resistor 176. Accordingly, variations in circuit parameters which are due to manufacturing process variations and temperature produce complementary effects in converter 101 and compensating circuit 103. Furthermore, electrical isolation (separation) of the switched capacitor input circuits 10 and 12 of converter circuit 101 and of switched capacitor feedback circuits 14 and 16 of compensation circuit 103 from each other helps insure against the generation of interfering beat frequency signals.

The gates 173 and 174, like the gates 170 and 171, are operated by 3.6 mHz clock signals from signals of outputs PH3 and PH4. Therefore, no beat frequencies are generated by operation of the two switched capacitor circuits 14 and 16 of the compensation circuit 103.

In converter circuit 101, the switched capacitor input circuits 10 and 12 appear as a 277,777 ohm resistor with one terminal effectively connected to an +8 volt supply, while resistor 126 has one terminal connected to ground. In compensation circuit 103, the connections of the switched capacitor circuits 14 and 16 and the resistor 176 are reversed with respect to the +8 volt source of power supply 104 and ground. These complementary couplings (connections) tend to allow close tracking of voltages applied to the inputs of amplifiers 124 and 177 over a useful range of IC manufacturing process, operating temperature and power (voltage) supply variations. The resistors (e.g., 126 and 176) and capacitors (e.g. 115, 120 and 175) are manufactured (fabricated) to have the same structures within a group of the same type of devices such that the values thereof track with IC manufacture process and operating temperature variations.

FM detector 100 can be fabricated as an integrated circuit (IC) on a single semiconductor (e.g., silicon) substrate (body) using a complementary metal-oxide-semiconductor (CMOS) process or other IC processes.

It is to be understood that the specific embodiments described herein are merely illustrative of the spirit of the invention. Various modifications consistent with the spirit of the invention are possible. For example, only one input switched capacitor circuit can be used instead of the two input switched capacitor circuits 10 and 12 shown. Still further, a combination comprising a switched capacitor circuit (like switched capacitor 10), an operational amplifier (like opamp 124) and a continuous impedance feedback device (e.g., a resistor - like resistor 127) is useful to perform a linear FM detector function (i.e., a frequency to voltage conversion). In this combination an output of the switched capacitor circuit is coupled to an inverting input of the operational amplifier and the feedback resistor is coupled between the inverting input and an output of the amplifier. This combination can be modified so to include a non-inverting amplifier having an input coupled to the output of the inverting amplifier and having an output coupled to an output of the combination. Furthermore, the frequency to voltage converter 101 is useful by itself in some applications. Still further, the components of the above described combination can be arranged to form a new combination in which the switched capacitor circuit is used as the feedback circuit and the resistor is used as an input circuit with one terminal thereof coupled to the input of the amplifier and a second terminal thereof coupled to a voltage supply. The inputs of the switched capacitor serve as the inputs of the new combination. Furthermore, the FM detector 100 can be modified such that the switched capacitors 10 and 12 are used as a feedback circuit for opamp 124 and resistor 127 is used as an input circuit coupled by one terminal to the inverting input of opamp 124 and coupled by a second terminal to a voltage source. In this modification of FM detector 100, switched capacitor circuit 14 is used as an input circuit which couples the output of opamp 145 to the inverting input of opamp 177 and resistors 147, 149, 151, 153 and 155 (or a single replacement resistor) are used as a feedback circuit coupled between the inverting input and the output of amplifier 177.

The embodiments of the invention in which an exclusive property or privilege is claimed are defined as follows:

1. Circuitry comprising:
   a first amplifier having an input and an output;
   a first switched capacitor circuit having an output and having inputs coupled to circuitry input terminals, said first switched capacitor circuit being controlled by signals applied to the inputs thereof;

the output of the first switched capacitor circuit being coupled to the input of the first amplifier;

a first continuous time impedance feedback circuit being coupled between the input and the output of the first amplifier;

a second amplifier having a first input and having an output coupled to a circuitry output terminal;

a gain matching circuit having a first terminal coupled to the output of the first amplifier and having a second terminal coupled to the input of the second amplifier, the ratio of the impedance of the gain matching circuit to the impedance of the first continuous time impedance feedback circuit being at a preselected value; and a second switched capacitor circuit having inputs and being coupled between the input and the output of the second amplifier, said second switched capacitor circuit being adapted to be controlled by signals applied to the inputs thereof.

2. The circuitry of claim 1 wherein the first and second switched capacitor circuits have similar structures and are fabricated using the same process such that variations in the process and operating temperature variations essentially cancel each other.

3. The circuitry of claim 2 further comprising:
a third amplifier which is an non-inverting amplifier and has an input and an output;
a fourth amplifier which is an inverting amplifier and which has an input and an output;
the output of the first amplifier being coupled to the input of the third amplifier;
the output of the third amplifier being coupled to the input of the fourth amplifier;
the output of the fourth amplifier being coupled to the first terminal of the gain matching circuit such that the gain matching circuit is coupled by the first terminal through the third and fourth amplifiers to the output of the first amplifier; and
the continuous time impedance feedback circuit comprises a feedback resistor,
the first and second amplifiers being inverting amplifiers.

4. The circuitry of claim 3 wherein the gain matching circuit comprises a first plurality of serially coupled essentially equal value resistors and a separate capacitor of a first plurality of capacitors being coupled to a common terminal between adjacent resistors of the first plurality of resistors.

5. The circuitry of claim 4 further comprising:
the first switched capacitor circuit having a first reference voltage terminal;
a separate first resistor having a first terminal coupled to the input of the first amplifier and having a second reference voltage terminal;
a separate second resistor having a first terminal coupled to the input terminal of the second amplifier and having a third reference voltage terminal; and
a third switched capacitor circuit having a first terminal coupled to the input of the second amplifier and having a second terminal coupled to the second reference voltage terminal of the first resistor.

6. The circuitry of claim 5 further comprising a fourth switched capacitor circuit having inputs coupled to circuitry input terminals, having an output coupled to the input of the first amplifier and having a terminal coupled to the first reference voltage terminal, said fourth switched capacitor circuit being controlled by signals applied to the inputs thereof.

7. The circuitry of claim 6 further comprising:
a resistor-capacitor network which couples the output of the third amplifier to the input of the fourth amplifier;
the ratio of the impedance of the gain matching circuit to the impedance of the first continuous time impedance feedback circuit is essentially one; and
wherein the resistor-capacitor network, gain matching circuit and the fourth amplifier form a frequency filter.

8. Circuitry comprising:
a first amplifier having an input and an output;
a first switched capacitor circuit having an output and having inputs coupled to circuitry input terminals, said first switched capacitor circuit being controlled by signals applied to the inputs thereof;
the output of the first switched capacitor circuit being coupled to the input of the first amplifier;
a first continuous time impedance feedback circuit being coupled between the input and the output of the first amplifier;
a second amplifier having a first input and having an output coupled to a circuitry output terminal;
a gain matching circuit having a first terminal coupled to the output of the first amplifier and having a second terminal coupled to the input of the second amplifier, the impedance of the gain matching circuit being essentially the same as the impedance of the first continuous time impedance feedback circuit;
a second switched capacitor circuit having inputs and being coupled between the input and the output of the second amplifier, said second switched capacitor circuit being adapted to be controlled by signals applied to the inputs thereof;
the first and second switched capacitor circuits have similar structures and are fabricated using the same process such that variations in the process and operating temperature variations essentially cancel each other;
a first resistor having a first terminal coupled to the input of the first amplifier and having a first voltage reference terminal;
the first switched capacitor circuit having a second reference voltage terminal;
a second resistor having a first terminal coupled to the input of the second amplifier and having a third reference voltage terminal; and
a third switched capacitor circuit having a terminal coupled to the input of the second amplifier and having another terminal coupled to the first reference terminal.

9. An integrated circuit FM detector comprising:
a frequency to voltage converter comprising a first amplifier, a first switched capacitor circuit and a continuous time impedance feedback circuit;
a compensation circuit comprising a second amplifier, a gain compensating impedance circuit and a second switched capacitor circuit;
the first switched capacitor circuit having inputs coupled to FM detector input terminals and having a first terminal coupled to an input of the first amplifier;
the continuous time impedance feedback circuit being coupled between an input and an output of the first amplifier;

the impedance of the compensating impedance circuit being essentially the same as that of the continuous time impedance feedback circuit;

an output of the first amplifier being coupled to a first terminal of the compensating impedance circuit;

the input of the second amplifier being coupled to a second terminal of the compensating impedance circuit;

the second switched capacitor circuit being coupled between an input and an output of the second amplifier and having inputs adapted to receive signals which control the operation thereof;

the output of the second amplifier being coupled to an FM detector output terminal; and the first and second switched capacitor circuits having similar structures and being fabricated using a common process such that variations in the process and in operating temperature cancel each other.

10. The integrated circuit FM detector of claim 9 further comprising:

offset voltage compensating circuitry comprising first and second resistors and a third switched capacitor circuit;

the first switched capacitor circuit having a first reference voltage terminal;

a first terminal of the first resistor being coupled to the input of the first amplifier;

a second terminal of the first resistor being coupled to a second reference voltage terminal;

a first terminal of the second resistor being coupled to the input of the second amplifier;

a second terminal of the second resistor being coupled to a third reference voltage terminal;

a first terminal of the third switched capacitor circuit being coupled to the input of the second amplifier; and a second terminal of the third switched capacitor circuit being coupled to the second reference voltage terminal of the first resistor.

11. An integrated circuit FM detector comprising:
a frequency to voltage converter comprising:
a first operational amplifier circuit arrangement;
a switched capacitor input circuit arrangement connected between a mid supply bias voltage source and an inverting input terminal of said first operational amplifier circuit arrangement and clocked in accordance with a received FM signal; and
a feedback resistor connected between the output terminal of said first operational amplifier circuit arrangement and said inverting input terminal thereof;
a compensation circuit arrangement comprising:
a compensating second operational amplifier circuit arrangement;
an input resistor corresponding in value and structure to said feedback resistor and being coupled between the output of the first operational amplifier circuit arrangement and the input of the second operational amplifier circuit arrangement;
a switched capacitor feedback circuit arrangement connected between an output terminal and an inverting input terminal of the second operational amplifier circuit arrangement, said switched capacitor feedback circuit being adapted to be clocked at a fixed frequency; and
means for coupling the output of the first operational amplifier circuit arrangement to the inverting input terminal of the second operational amplifier circuit arrangement.

12. The integrated circuit FM detector of claim 11 wherein said coupling means comprises a filter circuit arrangement.

13. An integrated circuit FM detector of claim 12 further comprising:
an offset compensation resistor connected between ground and said inverting input terminal of said first operational amplifier circuit arrangement; and
offset compensating means connected to said inverting input terminal of said compensating operational amplifier circuit arrangement for compensating for voltage offset.

14. The integrated circuit FM detector of claim 13 wherein said offset compensating means comprises a second compensating resistor connected between a full supply voltage and said inverting input terminal of said compensating amplifier and further comprises a third switched capacitor circuit arrangement clocked at said fixed frequency and connected between ground and said inverting input terminal of said compensating operational amplifier circuit arrangement.

15. An integrated circuit FM detector comprising:
a frequency to voltage converter comprising:
a first operational amplifier circuit arrangement comprising a first inverting input terminal, a first non-inverting input terminal and a first output terminal;
a first switched capacitor input circuit arrangement connected between a first potential source and said first inverting input terminal and clocked in accordance with a received FM signal; and
a feedback resistor connected between said first output terminal and said first inverting input terminal;
a compensation circuit arrangement comprising: a second operational amplifier circuit arrangement comprising a second inverting input terminal, a second non-inverting input terminal and a second output terminal;
an input resistor connected between said first output terminal and said second inverting input terminal and corresponding in value and structure to said feedback resistor;
a second switched capacitor feedback circuit arrangement connected between said second output terminal and said second inverting input terminal and clocked at a fixed frequency; and
means for coupling said first output terminal to said second inverting input terminal.

16. The integrated circuit FM detector of claim 15 wherein said coupling means comprises a filter circuit arrangement.

17. The integrated circuit FM detector of claim 16 wherein said detector further comprises:
an offset compensation resistor connected between a second potential source and said first inverting input terminal circuit; and
offset compensating means connected to said second inverting input terminal for compensating for voltage offset.

18. The integrated circuit FM detector of claim 17 wherein said offset compensating means comprises a compensating resistor connected between a third potential source and said second inverting input terminal; and a third switched capacitor circuit arrangement clocked at said fixed frequency and connected between said second potential source and said second inverting input terminal.

19. The integrated circuit FM detector of claim 18 wherein:
    said first potential source is a mid-supply voltage source; and
    said second potential source is a ground source and said third potential source is a full supply voltage source.

20. The integrated circuit FM detector of claim 19 wherein said first potential source is a 4 volt mid-supply voltage source, said second potential source is a ground source and said third potential source is an 8 volt full supply voltage source.

21. Circuitry comprising:
    a first amplifier having an input and an output;
    a first switched capacitor circuit having an output and having inputs coupled to circuitry input terminals, said first switched capacitor circuit being controlled by signals applied to the inputs thereof; the output of the first switched capacitor circuit being coupled to the input of the first amplifier;
    a first continuous time impedance input circuit having a first terminal coupled to the input of the first amplifier and having a second reference terminal;
    a second amplifier having a first input and having an output coupled to a circuitry output terminal;
    a gain matching circuit having a first terminal coupled to the output of the first amplifier and having a second terminal coupled to the input of the second amplifier, the ratio of the impedance of the gain matching circuit to the impedance of the first switched capacitor circuit being at a preselected value; and
    a second switched capacitor circuit having inputs and being coupled between the input and output of the second amplifier, said second switched capacitor circuit being adapted to be controlled by signals applied to the inputs thereof.

* * * * *